United States Patent [19]

Errico

[11] Patent Number: 5,042,085
[45] Date of Patent: Aug. 20, 1991

[54] RADIO FREQUENCY DATA COMMUNICATION BAND PASS FILTER

[75] Inventor: James H. Errico, Chicago, Ill.

[73] Assignee: Motorola, Inc., Schaumburg, Ill.

[21] Appl. No.: 351,358

[22] Filed: May 12, 1989

[51] Int. Cl.$^5$ .......................... H04B 7/00; H03H 7/12
[52] U.S. Cl. ..................................... 455/43; 455/339; 333/168
[58] Field of Search ................... 333/28 R, 167, 168, 333/14; 375/5, 17, 18; 455/339, 36, 43; 330/294, 302, 303, 304, 306; 379/93, 97

[56] References Cited

U.S. PATENT DOCUMENTS

| | | | |
|---|---|---|---|
| 4,156,867 | 5/1989 | Bench et al. | 375/5 |
| 4,280,020 | 7/1981 | Schmuir | 375/5 |
| 4,414,688 | 11/1983 | Hendriks et al. | 455/188 |
| 4,437,075 | 3/1984 | Darmouni | 333/168 |
| 4,481,489 | 11/1984 | Kurley | 375/5 |
| 4,581,750 | 4/1986 | Dreleman | 375/18 |
| 4,646,305 | 2/1987 | Tretter et al. | 375/18 |
| 4,714,905 | 12/1987 | Bernstein et al. | 333/168 |

Primary Examiner—Reinhard J. Eisenzopf
Assistant Examiner—Lisa Charouel
Attorney, Agent, or Firm—Timothy W. Markison; Steven G. Parmelee; Joseph P. Krause

[57] ABSTRACT

The RF data communication band pass filter is a fixed device that filters both RF multi-level data signals and binary-level data signals. The RF data communication band pass filter comprises a low pass filtering means having a corner frequency of approximately 2900 Hertz and as high pass filtering means of approximately 340 Hertz. By using precision components the overall group delay envelope is such that both multi-level RF data signals and binary-level RF data signals are adequately filtered without substantial harmonic distortion or spectral distortion. In addition, the communication band pass filter meets the strictest of international RF data communication requirements.

16 Claims, 1 Drawing Sheet

200

RADIO FREQUENCY DATA COMMUNICATION BAND PASS FILTER

TECHNICAL FIELD

This invention relates generally to filtering of radio frequency (RF) data communication signals. In particular, the invention incorporates one RF data communication band pass filter to filter both multi-level RF data signals and binary-level RF data signals.

BACKGROUND OF THE ART

RF data signals are generally either multi-level RF data signals or binary-level RF data signals. A communication system that communicates both multi-level RF data signals and binary-level RF data signals typically requires two RF data band pass filters; one for each type of signal. Two filters are required because multi-level RF data signals and binary-level RF data signals have substantially different filtering requirements, as described below. If two filters are not used, the system is either limited to communicating only one type of RF data signal or the system must employ a selectable RF data band pass filter. A selectable RF data band pass filter still limits the system to communicating only one type of RF data signal at a time and requires the filter to be altered whenever the other type of RF data signal is desired.

A typical multi-level RF data signal is an approximation of a sinusoidal waveform produced by quantizing, at fixed intervals, the sinusoid into multiple discrete currents or voltages. By varying the magnitude of the discrete currents or voltages, various tone frequencies can be obtained. The variation of the tone frequencies, at the fixed intervals, defines signalling formats, such as Select Five or Five Tone. To properly filter a multi-level RF data signal, the band pass filter must have a bandwidth of approximately 340 Hertz to 2900 Hertz. The attenuation at the first corner frequency (340 Hz) must be at least a two pole roll off, and the attenuation at the second corner frequency (2900 Hz) must be at least a three pole roll off. The multi-level RF data band pass filter must also have a tolerance of ±1 dB, with respect to a nominal level, over the entire bandwidth to minimize spectral distortion. In order to meet the above requirements, a multi-level RF data band pass filter generally has a group delay envelope in excess of 200 uSec. In part, because of the substantial group delay envelope, a multilevel RF data band pass filter will not properly filter binary-level RF data signals.

Typical binary-level RF data signals are fast frequency shift keying (FFSK) and Motorola's STAT ALERT ™. To properly filter a binary-level RF data signal, the band pass filter must have a group delay envelope of about 20 uSec when passing binary-level RF data signals in the frequency range of about 1100 Hertz to 1800 Hertz and about 35 uSec when passing binary-level RF data signals in the frequency range of about 950 Hertz to 1100 Hertz and about 1800 Hertz to 2000 Hertz. The group delay envelope requirements are tightly controlled such that the total harmonic distortion of the binary-level RF data signal is minimized. In addition, a binary-level band pass filter has a bandwidth requirement of approximately 900 Hertz to 2200 Hertz. The attenuation at the first corner frequency (900 Hz) and the second corner frequency (2200 Hz) are typically less than the multi-level band pass filter attenuation requirements. Further, the binary-level RF data band pass filter has a tolerance requirement of about ±1.45 dB, with respect to a nominal level, over the entire bandwidth. Because the bandwidth, attenuation, and tolerance requirements of a binary-level RF data band pass filter are substantially less than the requirements of a multi-level RF data band pass filter, the group delay envelope requirements of the binary-level RF data band pass filter are obtainable. As a result of the substantially different filtering requirements, prior art binary-level RF data band pass filters and prior art multi-level RF data band pass filters are not interchangeable.

A further difficulty of using one common band pass filter for both multi-level and binary-level RF signals is the strict international requirements for data communication signals. At present, the strictest international requirements are generated by the British Standard Institute. Under the British Standard guidelines the nominal level is −12 dBm, in comparison to the United States which requires the nominal be less than 10 dBm. The British Standard also requires that the energy levels of all signals having frequencies above 3600 Hertz be less than −34 dBm.

A need exists for radio frequency data communication band pass filter than will accommodate both multi-level RF data signals and binary-level RF data signals without selectable alterations, and will comply with international requirements.

SUMMARY OF THE INVENTION

The need described above is substantially met by the radio frequency data communication band pass filter disclosed herein. The radio frequency data communication band pass filter consists of a first corner frequency circuit and a second corner frequency circuit. The first corner frequency circuit establishes a first corner frequency and has a maximum predetermined group delay envelope, such that RF data signals having a frequency below the first corner frequency are attenuated and RF data signals having a frequency above the first corner frequency pass at a nominal level. The second corner frequency circuit, also having a maximum predetermined group delay envelope, is operably coupled to the first corner frequency circuit and establishes a second corner frequency, such that RF data signals having a frequency below the second corner frequency are passed at substantially the nominal level and RF data signals having a frequency above the second corner frequency are attenuated. The second corner frequency is typically great than the first corner frequency.

In one embodiment, the first corner frequency is about 340 Hertz and the second corner frequency is about 2900 Hertz. The RF data band pass filter has a total group delay envelope of about 20 microseconds when passing RF data signals having a frequency between 1100 Hertz and 1800 Hertz. The band pass filter further has total group delay envelope of approximately 35 microseconds when passing RF data signals having a frequency between 950 Hertz and 1100 Hertz and between 1800 Hertz and 2000 Hertz.

In another embodiment, an RF data communication system incorporates an operator control panel, a communication resource selector, a base station, and an RF data communication band pass filter wherein the RF data communication band pass filter has sufficient parameters to pass both binary-level and multi-level RF data signals.

BEST MODE FOR CARRYING OUT THE INVENTION

In order for an RF data band pass filter to accommodate both multi-level data signals and binary-level RF data signals the filter must meet the binary-level Rf data signal group delay envelope requirements, the multi-level RF data signal bandwidth requirements, and the multi-level RF data signal nominal level tolerance requirements. In addition to the above requirements, the filter should also accommodate international requirements.

Figure 1:
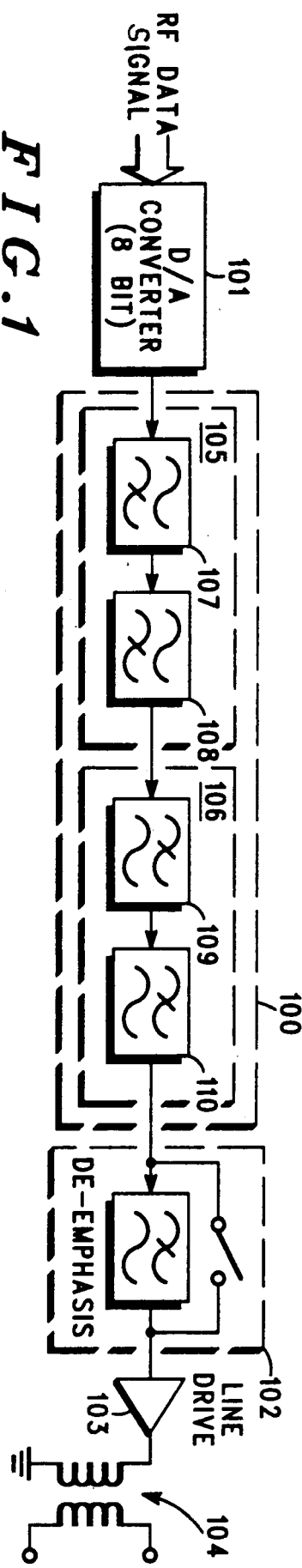
FIG. 1 illustrates an RF data communication band pass filter in series with an 8 bit D/A converter and a selectable de-emphasis circuit.

FIG. 1 illustrates the radio frequency data communication band pass filter (100) that meets these requirements. The filter (100) is in series with an 8 bit D/A converter (101), a selectable de-emphasis circuit (102), a line driver (103), and a transformer (104). The filter (100) comprises a first corner frequency circuit (105) connected in series to a second corner frequency circuit (106). The 8 bit D/A converter (101) receives RF data signals, either binary-level RF data signals or multi-level RF data signals, and converts them to analog signals. The analog signals are then filtered by the filter (100) and, when selected, the selectable de-emphasis circuit (102). The selectable de-emphasis circuit (102) further filters the RF data signals to improve the high frequency response and is enabled only if the communication resources are equipped with emphasis circuits (not shown). The output of the selectable de-emphasis circuit (102) is coupled to the line driver (103) which drives the transformer (104) such that the filtered signals are amplified. The filtered and amplified RF data signals are then sent to a base station (not shown) for transmission to the communication resources. Typical communication resources are predetermined frequencies, frequency pairs, or TDM time slots.

The first corner frequency circuit (105) comprises two high pass filters (107 & 108). Both high pass filters (107 & 108) are designed using precision components (typical tolerances of ±1% for resistors, and ±5% for all other components), wherein the first highpass filter (107) forms a two pole network, and the second high pass filter (108) forms a single pole network. When the two high pass filters (107 & 108) are connected in series, the first corner frequency circuit attenuates RF data signals having frequencies below the first corner frequency and passing, at a nominal level, the RF data signals having frequencies above the first corner frequency. The first corner frequency is set at 340 Hertz ±10% such that RF data signals having frequencies below 340 Hertz are attenuated at a three pole rate, however, a two pole rate may be adequate.

The second corner frequency circuit (106) comprises two low pass filters (109 & 110). Both low pass filters (109 & 110) are designed using precision components, wherein the first low pass filter (109) forms a two pole network having relatively high quality factor (Q), and the second low pass filter (110) forms a three pole network having a Q considerably lower than the Q of the first low pass filter (109). When the two low pass filters (109 & 110) are connected in series, a second corner frequency is formed at 2900 Hertz ±10%. The second corner frequency circuit (106) passes, at a nominal level, RF data signals having frequencies below 2900 Hertz and attenuates RF data signals having frequencies above 2900 Hertz at a five pole rate, however, a three pole rate may be adequate.

When the first corner frequency circuit (105) is connected in series with the second corner frequency circuit (106), the RF data communication band pass filter is formed. The group delay envelope of the first and second corner frequency circuits (105 & 106) are individually not critical, as long as the sum of the two group delay envelopes are less than the requirements for binary-level RF data signals. Through the use of precision components and optimum compensation network design, the total group delay envelope was tested to be about 20 uSec for RF data signals in the frequency range of 1100 Hertz to 1800 Hertz±10% and about 35 uSec for RF data signals in the frequency range of 950 Hertz to 1100 Hertz±10% and 1800 Hertz to 2000 Hertz±10%. Further experimentation revealed that the group delay envelope could be increased by at least 5 uSec and maintain satisfactory performance, i.e. the total harmonic distortion is acceptable, however, to maintain an error margin the above mentioned figures should be used.

In addition to meeting the group delay envelope requirements, the RF data communication band pass filter also maintains a tolerance of ±1 dB over the entire bandwidth and conforms to the international data communication requirements. Again, through the use of precision components and optimum compensation network design, the filter was able to meet the filtering requirements for both multi-level RF data signals and binary-level RF data signals.

The series orientation of the first corner frequency circuit (105) and the second corner frequency circuit (106) is not critical, nor is the orientation of the first and second low pass filters (109 & 110) or the orientation of the first and second high pass filters (107 & 108). Though design and experimentation, it was discovered that the parts count could be reduced by optimizing the filter elements (107-110) series orientation. By placing the high Q low pass filter (109) first, with respect to the incoming RF data signals, followed by the first high pass filter (107), the low Q low pass filter (110), and the second high pass filter (108) the parts count was reduced. The characteristic impedance of the filter's (100) load, in this design the line driver (103) and the transformer (104), should be considered when calculating the compensation network for each filter element (107-110).

Figure 2:
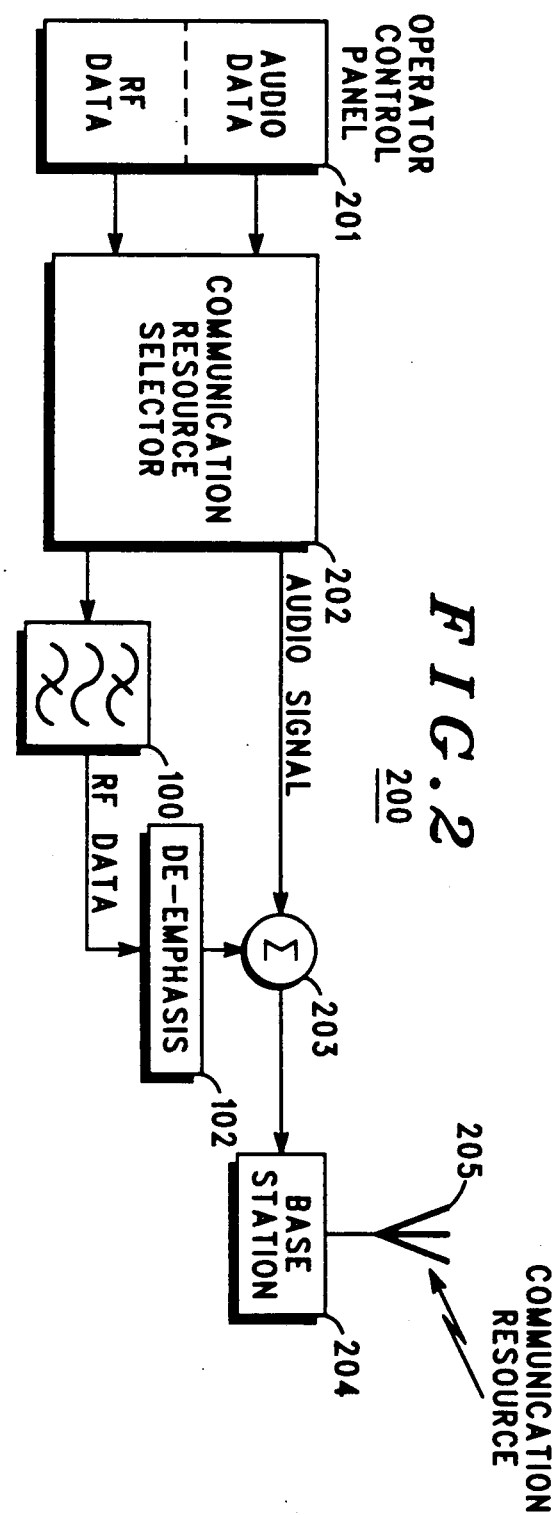
FIG. 2 illustrates a communication system that incorporates the RF data communication band pass filter.

FIG. 2 illustrates a communication system (200) that comprises an operator control panel (201), a communication resource selector(202), the RF data communication band pass filter (100), the selectable de-emphasis circuit (102), a summing circuit (203), a base station (204), and an antenna (205). The communication system (200) allows an operator to communicate both audio data and RF data to a selected communication resource. (In the scope of this invention communicate refers to receiving, transmitting or transmitting and receiving RF data or audio data.) The operator generates either audio or RF data at the operator control panel (201) and selects which communication resource he desires to communicate with by enabling the appropriate communication resource selector channel (not shown).

If the operator is communicating RF data signals, the signals are sent from the operator control panel (201) through the communication resource selector (202), the RF data communication band pass filter (100), the de-emphasis circuit (102) and the summing circuit (203) to the base station (204) such that the RF data can be communicated to the communication resource via the antenna (205). The RF data communication band pass filter (100) allows the system (200) to communicate with communication resources that incorporate either multi-level RF data signals or binary-level RF data signals. The use of this filter (100) removes, from the operator, the burden of selecting between binary-level communication and multi-level communication and knowing which type of signal the communication resources are using.

The operation of the band pass filter (100) is identical to the above discussion. It should be noted that the communication system (200) described herein is also applicable to any communication device that transmits RF data signals, such as computer modems.

What is claimed is:

1. A radio frequency (RF) data communication band pass filter for passing RF data signals having frequencies in a frequency range of about 340 Hertz to about 2900 Hertz and for attenuating RF data signals having frequencies outside the frequency range, where the RF data signals are multi-level RF data signals or binary-level RF data signals are multi-level RF data signals or binary-level RF data signals, the RF data communication band pass filter comprises:

first corner frequency means for attenuating the RF data signals having a frequency below a first corner frequency and for passing, at a nominal level without substantial deviation, the RF data signals having a frequency above the first corner frequency; and second corner frequency means, operably coupled to the first corner frequency means, for passing, at substantially the nominal level without substantial deviation, the RF data signals having a frequency below a second corner frequency and for attenuating the RF data signals having a frequency above the second corner frequency, wherein the second corner frequency is greater than the first corner frequency;

such that both multi-level RF data signals and binary-level data signals are passed through the RF data communication band pass filter without substantial spectral distortion, without substantial total harmonic distortion, and within a maximum predetermined group delay envelope.

2. The RF data communication band pass filter of claim 1 wherein the first corner frequency is at most about 340 Hertz and the second corner frequency is at least about 2900 Hertz.

3. The RF data communication band pass filter of claim 1 further comprises a selectable de-emphasis circuit operably associated with the first corner frequency means and the second corner frequency means.

4. The RF data communication band pass filter of claim 1 wherein the maximum predtermined group delay envelope is at most about 20 microseconds (uSec) for passing the RF data signals having frequencies in a range of about 1100 Hertz to about 1800 Hertz and the maximum predetermined group delay envelope is at most about 35 uSec for passing the RF data signals having frequencies in a range of about 950 Hertz to about 1100 Hertz and in the range of about 1800 Hertz to about 2000 Hertz.

5. The RF data communication band pass filter of claim 1 wherein the binary-level RF data signals comprise fast frequency shift keying type signals and STAT ALERT TM.

6. The RF data communication band pass filter of claim 1 wherein the multi-level RF data signals comprise Select Five and Five Tone type signals.

7. The RF data communication band pass filter of claim 1 wherein the first corner frequency means attenuates the RF data signals having a frequency below the first corner frequency by at least about 12 dB/octave.

8. The RF data communication band pass filter of claim 1 wherein the second corner frequency means attenuates the RF data signal having a frequency above the second corner frequency by at least about 18 dB/octave.

9. An improved data communication system for communicating radio frequency (RF) data signals, the data communication system having:

an operator control panel that allows an operator to communicate the RF data signals to and from desired communication resources:

communication resource selection means, operably coupled to the operator control panel, for selecting the desired communication resources;

base station means, operably coupled to the operator control panel and the communication resource selection means, for communicating the RF data signals to and from the communication resources;

wherein the improvement comprises:

RF data communication band pass filter means, operably coupled to the base station means and the communication resource selection means, having a maximum predetermined group delay envelope, for passing, at a nominal level without substantial spectral distortion and without substantial total harmonic distortion, multi-level RF data signals and binary-level RF data signals having frequencies between a first corner frequency and a second corner frequency and for attenuating the multi-level RF data signals and binary-level RF data signals having frequencies not between the first corner frequency and the second corner frequency, wherein the second corner frequency is greater than the first corner frequency.

10. The improved data communication system of claim 9 wherein the first corner frequency is at most about 340 Hertz and the second corner frequency is at least about 2900 Hertz.

11. The improved data communication system of claim 9 further comprises a selectable de-emphasis circuit operably coupled to the RF data communication band pass filter.

12. The improved data communication system of claim 9 wherein the maximum predetermined group delay envelope is at most about 20 microseconds (uSec) for passing the multi-level RF data signals and binary-level RF data signals having frequencies in a range of about 1100 Hertz to about 1800 Hertz and the maximum predetermined group delay envelope is at most about 35 uSec for passing the multi-level RF data signals and binary-level RF data signals having frequencies in a range of about 950 Hertz to about 1100 Hertz and in the range of about 1800 Hertz to about 2000 Hertz.

13. The improved data communication system of claim 9 wherein the binary-level RF data signals comprise fast frequency shift keying type signals and STAT ALERT ™.

14. The improved data communication system of claim 9 wherein the multi-level RF data signals comprise Select Five and Five Tone type signals.

15. The improved data communication system of claim 9 wherein RF data communication band pass means attenuates the multi-level RF data signals and binary-level RF data signals having a frequency below the first corner frequency by at least about 12 dB/octave.

16. The improved data communication system of claim 9 wherein the RF data communication band pass means attenuates the multi-level RF data signals and binary-level RF data signals having a frequency above the second corner frequency by at least about 18 dB/octave.

* * * * *